United States Patent [19]

Kuze

[11] Patent Number: 4,467,458

[45] Date of Patent: Aug. 21, 1984

[54] READ-ONLY SEQUENCE CONTROLLER

[76] Inventor: Yoshikazu Kuze, 31-3, Higashimagome 1-chome, Ohta-ku, Tokyo, Japan, 143

[21] Appl. No.: 279,980

[22] PCT Filed: Oct. 30, 1979

[86] PCT No.: PCT/JP79/00276

§ 371 Date: Jun. 26, 1981

§ 102(e) Date: Jun. 26, 1981

[87] PCT Pub. No.: WO81/01338

PCT Pub. Date: May 14, 1981

[51] Int. Cl.³ ............................................. G11C 8/00
[52] U.S. Cl. ............................................. 365/230
[58] Field of Search .................. 365/230, 233, 236, 94

[56] References Cited

FOREIGN PATENT DOCUMENTS 54-28983  3/1979  Japan .................................. 365/236

Primary Examiner—James W. Moffitt
Attorney, Agent, or Firm—John T. Roberts

[57] ABSTRACT

A small size sequence controller for a read-only memory in which data stored in a read-only memory (4) are read out sequentially to operate an output relay during a time interval in accordance with the stored data, and the relay controls a load. Clock pulses generated by a frequency-dividing clock pulse generator (36) are applied to presettable down counters (38), (39) in which the clock pulses are divided down to pulses each having the time period corresponding to the preset value. The divided pulses are applied to a binary counter (34). Predetermined data are stored in the read-only memory (4) in advance. When addresses are allocated by the binary counter (34), data outputs (D1)–(D8) deliver "1" or "0" data in parallel. The data outputs are applied to an output relay which is rendered "ON" or "OFF" in accordance with the data "1" or "0". The time interval when the output relay is kept "ON" or "OFF" can be varied by changing a selecting switch (8) or changing the preset values of the presettable down counters (38) and (39).

2 Claims, 7 Drawing Figures

READ-ONLY SEQUENCE CONTROLLER

CROSS-REFERENCE TO RELATED APPLICATIONS

This invention is in part disclosed in a co-pending application entitled Read Clock Pulse Controller, Ser. No. 279,979, filed June 26, 1981, in a co-pending application entitled Read-Only Sequence Controller, Ser. No. 279,981, filed June 26, 1981, and in a co-pending application entitled Read-Only Sequence Control System, Ser. No. 328,574, filed Dec. 3, 1981.

TECHNICAL FIELD

The present invention relates to a read-only sequence controller and more particularly to a sequence controller of a stored program system having an EPROM attached thereto.

BACKGROUND ART

A conventional sequence controller has a writing means and a reading means. However, the writing means is not used after a necessary data has been written in. Therefore the sequence controller having the writing means which is scarcely used is very unreasonable and expensive. In order to remove such disadvantages, it should be attempted to provide a sequence controller having a single function.

DISCLOSURE OF THE INVENTION

In accordance with the present invention, the sequence controller is divided into a write-only sequence controller and a read-only sequence controller. The write-only sequence controller is provided for writing data in an EPROM or MASK ROM to be attached thereto. The read-only sequence controller is adapted to mount the EPROM or ROM and to produce an output of the data in the EPROM or ROM.

Since data may be written in a plurality of EPROMs by one write-only sequence controller, an economical control system may be provided. Accordingly, only one write-only sequence controller can be used for writing data in EPROMs for a plurality of read-only sequence controllers, even 1000 units of read-only sequence controller.

Since the read-only sequence controller is not provided with a write-in device, it may be made into a compact device at a low cost. The controller may be easily operated. That is, data is obtained by merely depressing a start switch after selecting a cycle time. Since the read-only sequence controller of the present invention may be made into a light device of a compact size, automatization of machine and for energy saving may be expected.

BEST MODE FOR EMBODYING THE INVENTION

Figure 1:
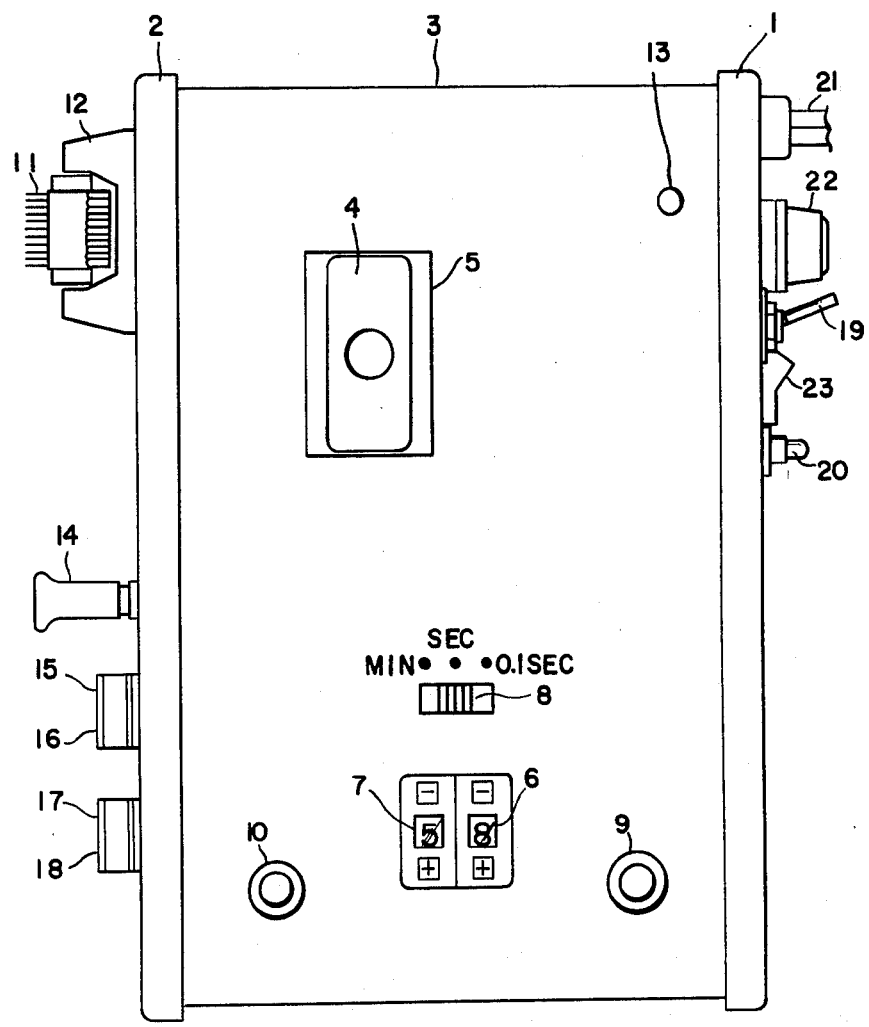
FIG. 1 shows a plan view of a read-only sequence controller according to the present invention.

Referring to FIG. 1, a case of the sequence controller comprises panel plates 1 and 2 and a pair of covers 3 made of metal plate. An EPROM 4 is detachably fixed to a connector 5. Preset code switches 6 and 7 display digits of two figures as the sequence cycle time. Numeral 8 is a cycle time selection switch, 9 is a start switch, 10 is a stop switch. A ribbon cable 11 is connected to an outside output relay unit through a connector 12. Numeral 13 is a pilot lamp. An abnormality detecting connector 14 is connected to an outer abnormality detecting circuit. An auto-start connector 15 is connected to an outside remote controller and auto-stop connector 16 is connected to the outside remote controller. A connector 17 is connected to an outside remote control manual start switch. A connector 18 is connected to an outside remote control stop switch. When a changeover switch 19 is turned OFF, one cycle of operation is done, while the switch 19 is turned ON, the cycle is repeated. Numeral 20 designates a reset switch, 21 is a supply code, 22 is a fuse, and 23 is a power switch.

Figure 2:
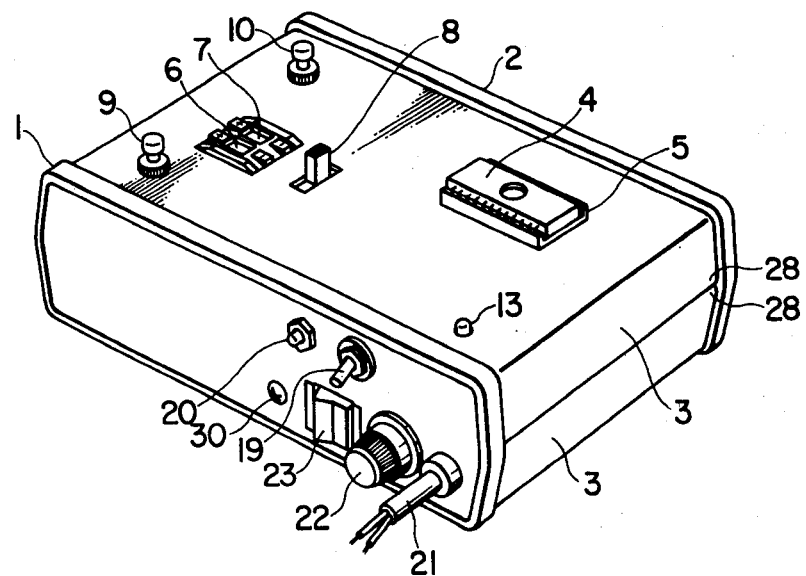
FIG. 2 shows a perspective view of the sequence controller.
Figure 3:
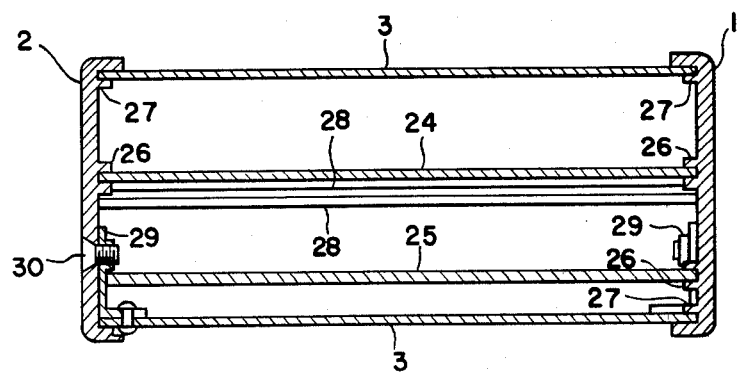
FIG. 3 shows a cross sectional view of the sequence controller.

As shown in FIGS. 2 and 3, a pair of supporting projections 26 for a printed-wiring boards 24 and 25 and projections 27 for covers 3 are formed in panels 1 and 2. Opposite end portions of each cover 3 are outwardly inclined and bent at ends 28 to reinforce the portions. Both covers 3 are abutted at bent ends 28 and supported between the projections 27 and secured by L-shaped members 29 and screws 30.

In order to generate data from the EPROM 4, first preset code switches 6 and 7 and the select switch 8 are operated to select a necessary cycle time. If the select switch 8 is set to 0.1 SEC, digits "58" shown in FIG. 1 means that a cycle time of 5.8 seconds is provided. If the select switch is set to SEC, the cycle time is 58 seconds. Further, setting the select switch to MIN, makes the cycle time of 58 minutes. Each of the digits of the preset code switch can be changed from "0" to "9". Accordingly, 297 kinds of cycle time are available in total.

Figure 4:
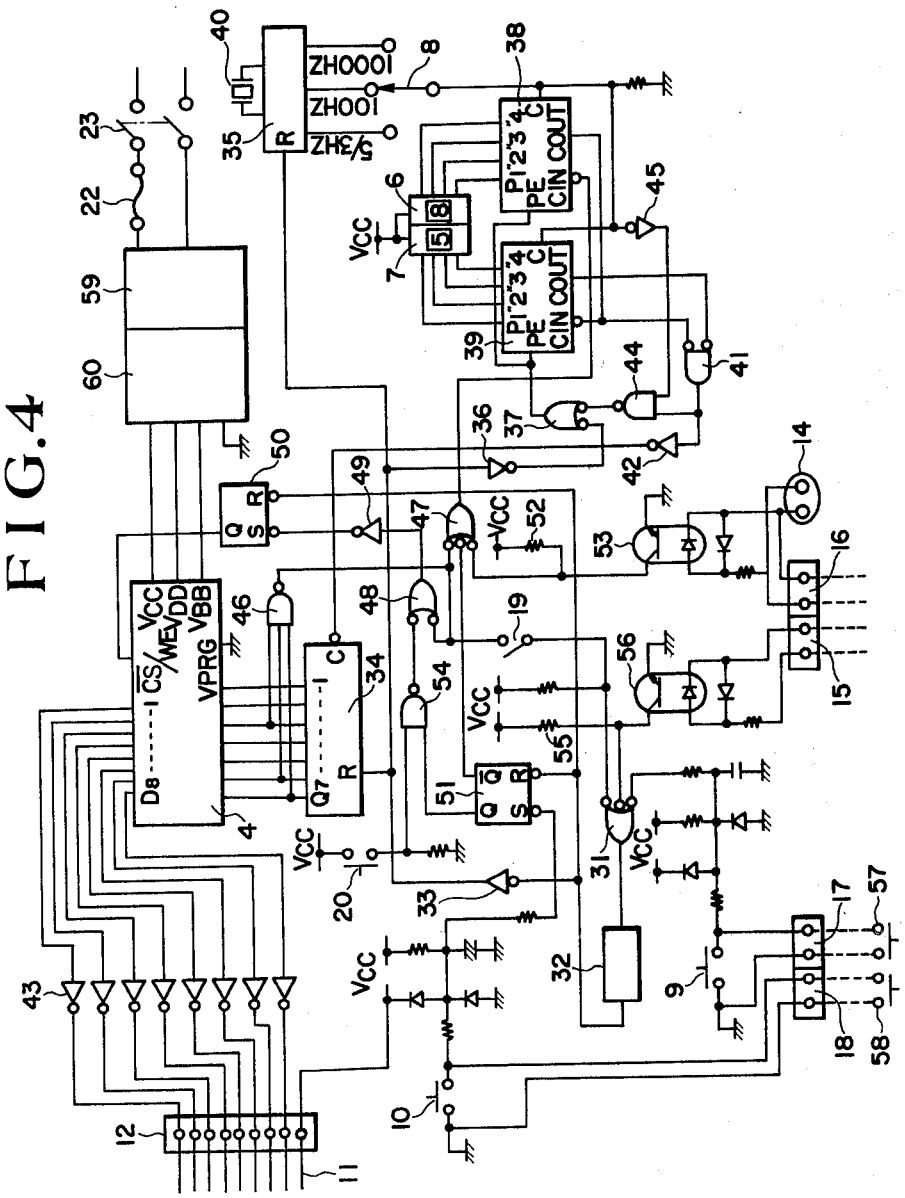
FIG. 4 shows a circuit of a read clock pulse controller of the present invention.

Referring to FIG. 4, ribbon cable 11 is connected to the output relay unit. The cycle time is set, the changeover switch 19 is set to one-cycle side (OFF), and then the start switch 9 is depressed. A signal "0" is applied to a 3-input NAND gate 31 through a filter circuit and a gate protective circuit comprising resistors, a capacitor, and diodes. By the output "1" from the gate 31, a one-shot pulse "0" appears at the output of a one-shot pulse generating circuit 32. This signal is inverted through an inverter 33 to a one-shot pulse "1". This one-shot pulse "1" is applied A. to a reset R of a binary counter 34 to reset it to the zero state, B. to a reset R of a clock pulse generating circuit 35 comprising a frequency dividing circuit to reset it to the zero state, and C. to inputs PE of presettable counters 38 and 39 through an inverter 36 and a 2-input NAND gate 37 to preset the digit "58" of preset code switches 6 and 7 in counters.

Output of a crystal oscillator 40 is divided by the clock pulse generating circuit 35 into 1000 Hz, 100 Hz, and 5/3 Hz as clock pulses. Any one of these clock pulses is selected by a select switch 8.

The clock pulses are applied to clock lines C of the presettable counters 38 and 39 through the select switch 8. Preset terminals P1, P2, P3 and P4 of the presettable counters are connected to BCD lines of preset code switches 6 and 7. Here it is assumed that each of presettable counters 38 and 39 is used as a down counter by connecting the UP/DOWN input thereof to the ground (not shown).

Each time one clock pulse is applied to the presettable counter 38, the count therein decreases by one. When the count goes to zero, the upper figure is changed from "5" to "4" and the lower figure is changed to "9". When 58 clock pulses are applied to the presettable counters, both inputs of a 2-input NOR gate 41 go to a "0". Thus, the 2-input NOR gate produces one read clock pulse which is applied to the clock line C of the binary counter 34 through an inverter 32. Accordingly, the binary counter 34 produces outputs through address lines Q1, Q2 ... Q7, so that the data in the EPROM 4 are discharged from data output D1, D2 ... D8 in parallel and applied to the output relay units through the inverter 43, connector 12 and ribbon cable 11.

On the other hand, the output of the 2-input NOR gate 41 causes a 2-input NAND gate 44 to produce "0" when an inverter 45 produces output "1" by a negative going clock input. Thus, the presettable counter is preset through the 2-input NAND gate 37. At the same time, the "58" of preset code switches 6 and 7 are preset again in presettable counters 38 and 39.

Thereafter, every time 58 clock pulses are applied to presettable counters, one read clock pulse is generated. Time of one cycle is decided by the number of read clock pulse. Operation in the case of 100 clock pulses in one cycle will be explained hereinafter.

In order to produce the one-cycle end signal after 100 read clock pulses, address lines Q3, Q6 and Q7 of the binary counter 34 are selected for the inputs of a 3-input NAND gate 46. Since the binary number of "100" is 1100100, when the 100 read clock pulses are applied to the input of the binary counter 34, outputs on the address lines Q3, Q6 and Q7 go to "1" and the 3-input NAND gate 46 produces a one-cycle end signal "0". The one-cycle end signal causes:

A. A "1" be applied through a 3-input NAND gate 47 to the CIN line of the presettable down counter 38 and stops counting.

B. A "0" to be applied to a set input S of a first flip-flop 50 through a 2-input NAND gate 48 and an inverter 49, and the output Q "1" is applied to the $\overline{CS}$/WE of the EPROM of the read-only sequence controller and the EPROM turns to the non-selection state.

Therefore, the presettable counter as shown in FIG. 4 stops counting and the EPROM stops producing the output, so that the machine to be controlled by this system stops after 58 seconds operation. By such operation, inspection of operation of the machine may be taken place. If the changeover switch 19 is set to ON side, a one cycle end signal "0" is applied to the 3-input NAND gate 31. This causes the same result as depressing the start switch 9. Thus, A. The binary counter 34 is cleared.

B. The frequency dividing clock pulse generating circuit 35 is cleared.

C. A digit of the preset code switch is preset in the presettable down counter.

D. A "0" enters in the reset R of the first flip-flop 50 and the output Q "0" is applied to the $\overline{CS}$/WE of the EPROM of the read-only sequence controller and the EPROM turns to the selection state resuming its data output.

Then, the presettable down counter starts counting and read clock pulses are applied to the binary counter 34, so that address cells of the EPROM corresponding to address lines Q1, Q2 ... Q7 are addressed to produce programing data. Thus, the machine operation is repeatedly continued at the cycle time of 58 seconds.

In order to stop the operation, the switch 19 is turned off, so that the operation stops at the end of one cycle. Depressing the stop switch 10, a "0" is applied to the set input S of a flip-flop 51. A "0" of the output $\overline{Q}$ is applied to the 3-input NAND gate 47 to produce an output "1" which causes the stop of counting of the presettable counters.

Describing an abnormality detecting circuit, a collector of a photo transistor of a photo coupler 53, which is pulled up by a resistor 52, is connected to the ground through an emitter, and a light emitting diode is connected to the connector 14 to which the outer abnormality detecting circuit is connected. When the detecting circuit detects any abnormality, the photo coupler 53 turns on. Accordingly, a "0" is applied to the 3-input NAND gate 47, so that the presettable down counter stops counting and the machine stops.

In the case of inspection of the abnormality, depressing of the stop switch 10 for stopping of the presettable counter and depression of the reset switch 20 are carried out. The output of a NAND gate 54 goes to a "0" which is applied to the $\overline{CS}$/WE of the EPROM 4 of the read-only sequence controller through the 2-input NAND gate 48, inverter 49, and first flip-flop 50 for keeping the EPROM in non-selection state.

In the case that the system of the present invention is used for controlling manufacturing machines, an unfinished work may be easily removed from the machine in the stop condition and inspection and repair of the system may be done.

If the start switch 9 is depressed after inspection and repair, the hold condition by first and second flip-flops is released and operation is restarted. The connector 16 connected to the connector 14 is to be connected to the outside controller for stopping the system. When the outside controller applies a signal to the system, the photo coupler 53 is turned on to stop the operation of the system.

A collector of a photo transistor of a photo coupler 56, which is pulled up by a resistor 55, is connected to the ground through the emitter, and the light emitting diode is connected to the connector 15 by means of the diodes of their respective polarities as shown and a resistor. When an outside controller emanates a signal, the photo coupler 56 is turned ON and a signal "0" is applied to the 3-input NAND gate 31. This causes the same result as depressing the start switch 9. Thus, the controller starts the operation at the cycle time of 5.8 seconds. That is the connector 15 is connected to a remote control start circuit and the connector 16 is connected to a remote control stop circuit.

Describing about a manual remote control circuit, a connector 17 is connected to both sides of the start switch 9 and to an outside start switch 57. A connector 18 is connected to both sides of the stop switch 10 and to an outside stop switch 58.

A system supply voltage $V_{CC}$ is obtained by an AC/DC converter 59 and supply voltages $V_{DD}$, $V_{BB}$ are applied to an EPROM from a DC/DC converter 60.

Figure 5:
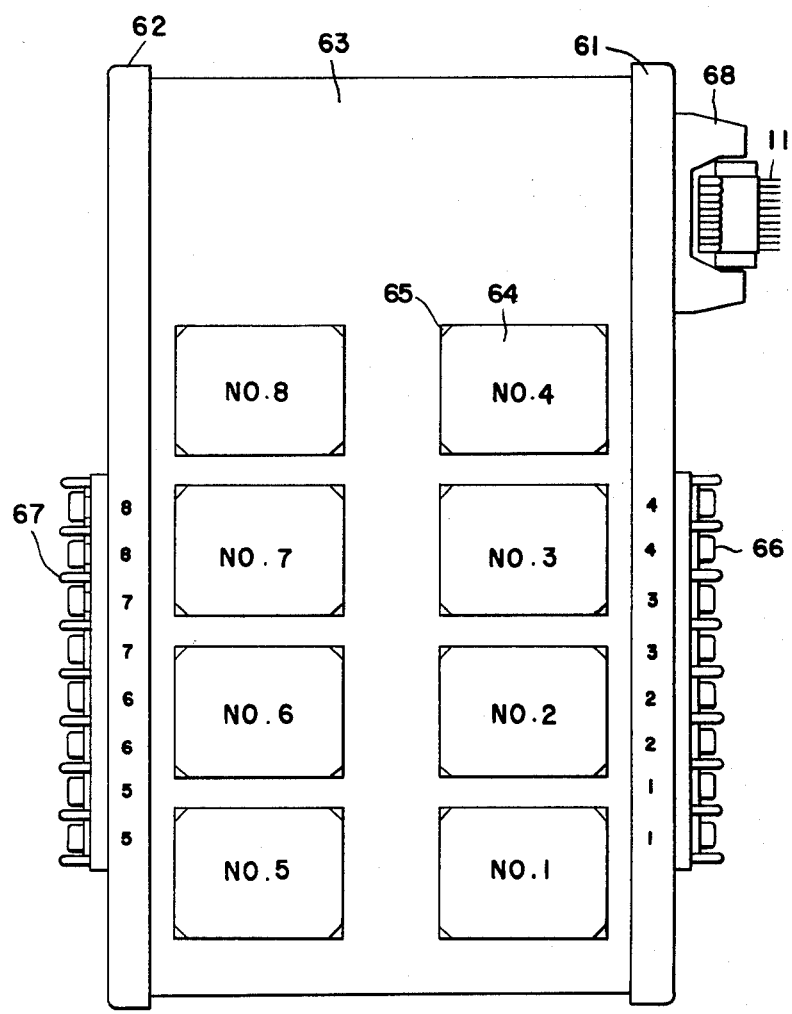
FIG. 5 shows a plan view of an output relay unit of contact relay system connected to the sequence controller.

Referring to FIG. 5, a case of the output relay unit cmprises panel plates 61 and 62 and a pair of covers 63 made of metal plate. A contact type relay 64 is constructed with eight relays into one unit. Each of relays 64 is inserted into a socket 65 and secured thereto. Terminals 66 and 67 are print-wired to outputs of the relays in such a manner as outputs of No. 1 relay are connected to terminals 1-1, outputs of No. 2 relay to terminals 2-2 ... outputs of No. 8 relay to terminals 8-8. An input connector 68 is connected through a ribbon cable 11 to an output connector 12 of a read clock pulse control system.

Figure 6:
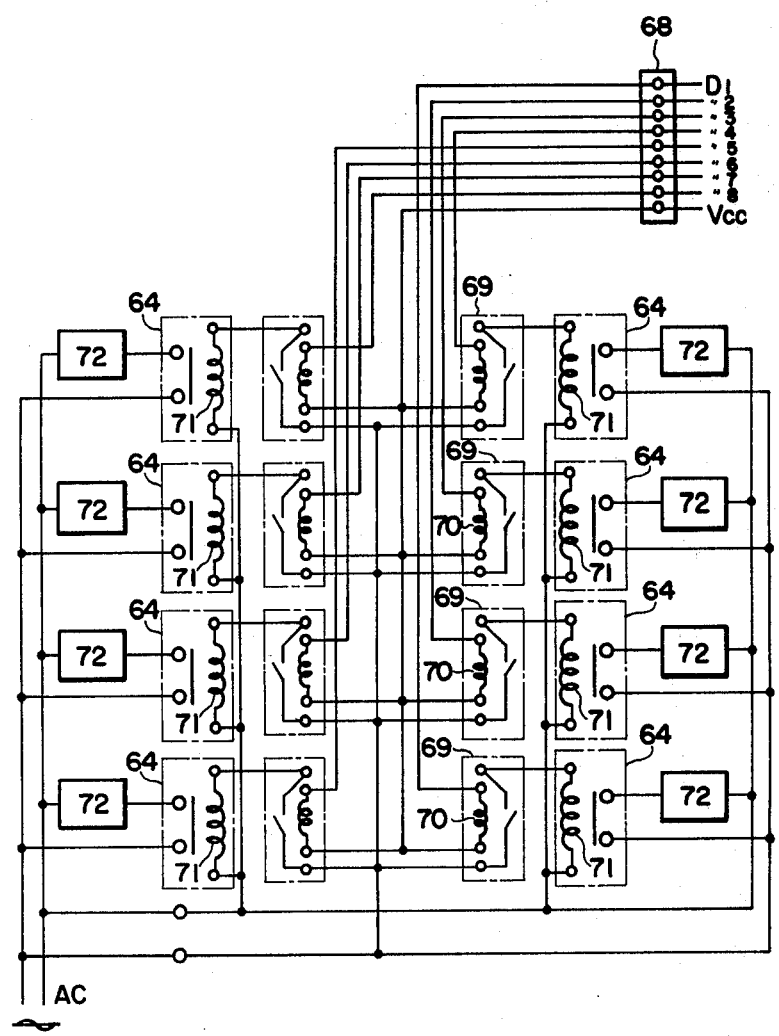
FIG. 6 shows a circuit of a contact relay system.

Referring to FIG. 6 showing a contact relay system, output data lines D1, D2 ... D8 of the EPROM are connected to the connector 68 through inverters 43 and ribbon cable 11.

Since driving circuits for eight output relays are the same construction, explanation about the driving circuit for the No. 1 output relay will be made hereinafter. The signal "1" appeared on the output D1 in the EPROM 4 is inverted to "0" by the inverter 43. The current flows from $V_{CC}$ through the coil 70 of the reed relay 69 so that the reed relay 69 is excited to turn on contacts thereof. Thus, current flows from the terminal AC to the coil 71 of the output relay 64 to turn on the relay 64 to drive load 72 connected to the output relay 64. When the output of the output D1 goes to "0", the read relay 69 turns off. Thus, the output relay 64 turns off so that driving of the load 72 stops.

Figure 7:
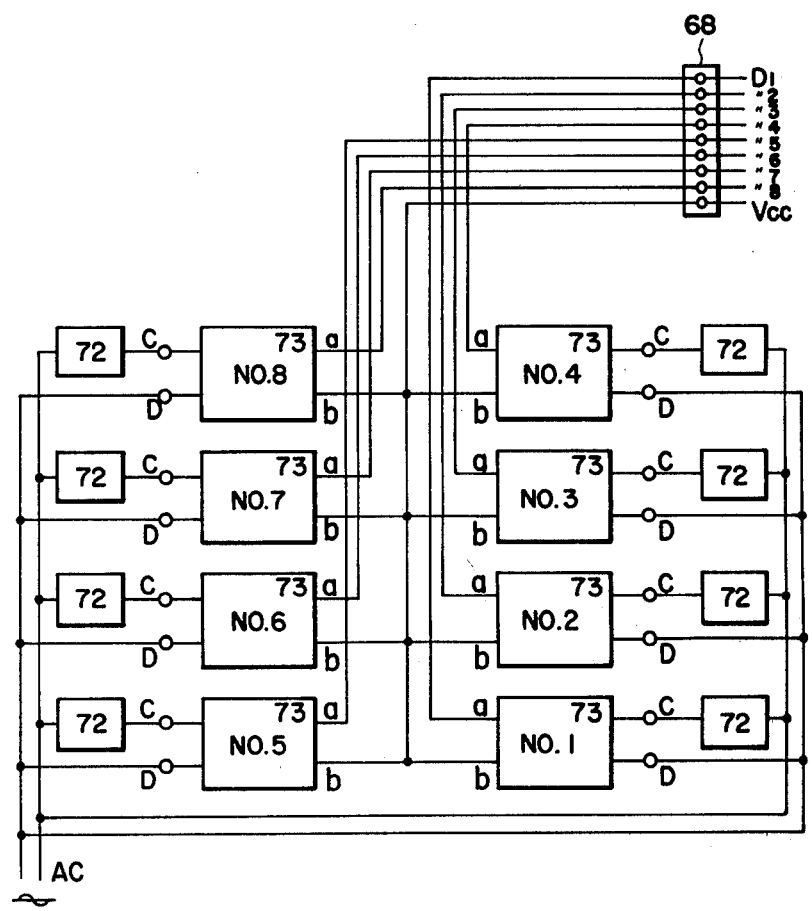
FIG. 7 shows a circuit of a contactless relay system.

Referring to FIG. 7 showing a contactless relay system, each of inputs a of contactless relays 73 is connected to data outputs D1, D2 ... D8 in the EPROM 4 through the inverter 43 and each input b is connected to $V_{CC}$. Outputs C and D of each relay are connected to a source AC through the load 72. When output of the data output is "1", the input a of the relay is "0". Thus, current flows between inputs b and a so that the relay 73 is turned on. When the output of the data output is "0", the relay 73 is turned off.

In the circuit of FIG. 6, although a reed switch circuit is used as an isolation circuit between DC and AC, another isolation circuit, such as a photo-coupler circuit, photothyristor circuit or Cds circuit, may be employed.

I claim:

1. A read-only sequence controller comprising:
   (a) an EPROM (4) having address lines and $\overline{CS/WE}$ line;
   (b) a first connector (5) for detachably connecting said EPROM to the read-only sequence controller;
   (c) a second connector (12) for connecting outputs of said EPROM with an outside unit;
   (d) a read clock pulse controller and gate means;
   (e) said read clock pulse controller comprising a starting circuit (9, 31, 32) for producing a start signal;
   (f) a clock pulse generating circuit (35) responsive to said start signal for producing clock pulses;
   (g) a select switch (8) for selecting the frequency of the read clock pulses;
   (h) a presettable counter (38, 39) for counting the read clock pulses;
   (i) a preset code switch (6, 7) for selecting the number of the read clock pulse counted by said presettable counter;
   (j) a binary counter (34) connected to the output of said presettable counter;
   (k) said binary counter being connected to said address lines of said EPROM;
   (l) said signal from said starting circuit resetting said binary counter, resetting said presettable counter and resetting the EPROM to resume its data output;

whereby said read clock pulse controller and gate means are adapted to control the operation of said EPROM.

2. A read-only sequence controller according to claim 1 wherein said read clock pulse controller produces a one-cycle end signal which is applied to the $\overline{CS/WE}$ line of said EPROM to cause said EPROM to stop producing output.

* * * * *